United States Patent
Lee

(10) Patent No.: US 6,803,128 B2
(45) Date of Patent: Oct. 12, 2004

(54) ORGANIC ELECTROLUMINESCENT DEVICE

(75) Inventor: Il Han Lee, Kyungsangnam-do (KR)

(73) Assignee: Samsung Oled Co., Ltd., Ulsan-si (KR)

( * ) Notice: Subject to any disclaimer, the term of this patent is extended or adjusted under 35 U.S.C. 154(b) by 0 days.

(21) Appl. No.: 10/394,066

(22) Filed: Mar. 24, 2003

(65) Prior Publication Data

US 2003/0190494 A1 Oct. 9, 2003

(30) Foreign Application Priority Data

Apr. 4, 2002 (KR) ......................................... 2002-18500

(51) Int. Cl.$^7$ ............................................. H05B 33/26
(52) U.S. Cl. ...................... 428/690; 428/215; 428/457; 428/470; 428/917; 313/504; 313/506
(58) Field of Search ................................. 428/690, 917, 428/470, 457, 215; 313/504, 506

(56) References Cited

U.S. PATENT DOCUMENTS

| | | | |
|---|---|---|---|
| 4,885,211 A | | 12/1989 | Tang et al. |
| 5,059,861 A | * | 10/1991 | Littman et al. ............. 313/503 |
| 5,059,862 A | * | 10/1991 | VanSlyke et al. .......... 313/503 |
| 5,429,884 A | | 7/1995 | Namiki et al. |
| 5,677,572 A | * | 10/1997 | Hung et al. ................. 257/750 |
| 5,739,635 A | | 4/1998 | Wakimoto |
| 5,776,622 A | | 7/1998 | Hung et al. |
| 5,776,623 A | | 7/1998 | Hung et al. |
| 5,937,272 A | | 8/1999 | Tang |
| 6,140,763 A | * | 10/2000 | Hung et al. ................. 313/503 |
| 6,545,359 B1 | * | 4/2003 | Ohtani et al. ............... 257/758 |
| 2002/0070663 A1 | * | 6/2002 | Ogura et al. ................ 313/506 |
| 2003/0152801 A1 | * | 8/2003 | Liao et al. .................. 428/690 |

FOREIGN PATENT DOCUMENTS

| | | | |
|---|---|---|---|
| JP | 07122177 A | * | 5/1995 |
| KR | 2002028614 A | * | 4/2002 |

OTHER PUBLICATIONS

G. E. Jabbour et al: Aluminum based cathode structure for enhanced electron injection in electroluminescent organic devices; Applied Physics Letters; vol. 73, No. 9; Aug. 31, 1998; pps. 1185–1187.

* cited by examiner

*Primary Examiner*—Dawn L. Garrett
(74) *Attorney, Agent, or Firm*—Staas & Halsey LLP

(57) ABSTRACT

An organic electroluminescent (EL) device and a method of manufacturing the same utilize a cathode, an anode, and organic layers formed between the cathode and the anode, wherein the cathode includes a first cathode containing aluminum, and a second cathode disposed under the first cathode, formed in the vicinity of an organic layer and containing a metal having a work function of 3.5 to 5.0 eV, and metallic carboxylate represented by:

RCOOM      Formula 1 wherein M is an alkali metal or alkaline-earth metal, and R is a $C_1$–$C_{10}$ alkyl or $C_6$–$C_{20}$ aryl.

16 Claims, 8 Drawing Sheets

ORGANIC ELECTROLUMINESCENT DEVICE

CROSS-REFERENCE TO RELATED APPLICATIONS

This application claims the benefit of Korean Patent Application No. 2002-18500 filed on Apr. 4, 2002, in the Korean Industrial Property Office, the disclosure of which is incorporated herein by reference.

BACKGROUND OF THE INVENTION

1. Field of the Invention

The present invention relates to an organic electroluminescent (EL) device, and more particularly, to an organic electroluminescent device having an improved efficiency of injecting electrons from a cathode to an organic layer.

2. Description of the Related Art

Recently, much attention has been paid to electroluminescent devices because they have advantageous features suitable for next generation display devices, such as a wide viewing angle, a high contrast ratio and a high response speed. In particular, organic electroluminescent devices using organic materials as raw materials for light emitting layers have advantageous characteristics, including a high luminance, a low driving voltage, a fast response rate, ability of producing a wide range of colors, compared to inorganic electroluminescent devices using inorganic materials as raw materials for light emitting layers.

An organic electroluminescent (EL) device is basically configured such that an anode is formed on a substrate, and a hole transport layer, an emitter layer, an electron transport layer, and a cathode are sequentially stacked on the anode. Here, the hole transport layer, the emitter layer and the electron transport layer are organic layers made of organic materials.

In the organic EL device having the above-described configuration, if a voltage is applied to the anode and the cathode, holes injected from the anode migrate to the emitter layer via the hole transport layer, and electrons from the cathode are injected into the emitter layer via the electron transport layer. The electrons and holes are recombined at the interface between the hole transport layer and the emitter layer (or the electron transport layer) to generate excitons. The generated excitons de-excite from an excited state to a ground state causing fluorescent molecules of the emitter layer to emit light, thus forming an image.

In the organic EL device driven as described above, to improve a low driving voltage characteristic and charge balance between electrons and holes, it is necessary to increase an efficiency of injecting electrons from a cathode into an organic layer, e.g., an electron transport layer, from a cathode. Conventional methods for increasing such injection efficiency have been proposed in U.S. Pat. Nos. 5,429,884, 5,059,862 and 4,885,211, describing use of an alkali metal having a low work function, e.g., lithium or magnesium, codeposition of an alkali metal and a metal such as aluminum or silver, and use of alloys of an alkali metal and a metal such as aluminum or silver, respectively.

However, the conventional methods have several problems. That is, since the metal that has a low work function is very unstable and highly reactive, use of the metal is disadvantageous in view of the processibility and the stability of EL device. In the case of codeposition, it is substantially difficult to control the mixture ratio of materials for forming an alloy. Also, use of alkali metals deteriorates reproducibility.

Other techniques for increasing the electron injection efficiency have been proposed in U.S. Pat. Nos. 5,776,622, 5,776,623, 5,937,272 and 5,739,635, and Appl. Phy Lett. 73 (1998) 1185, in which an electron injection layer containing inorganic materials such as LiF, CsF, SrO or $Li_2O$, is formed between a cathode and an organic layer to a thickness of 5 to 20 Å. However, according to these techniques, inorganic material film formation requires an extremely high temperature, and it is quite difficult to form a thin film having a uniform thickness of 5 to 20 Å.

Recently, another method for increasing an electron injection efficiency has been proposed in which an alkali metal acetate, e.g., $CH_3COOLi$ or $C_6H_5COOLi$, is formed between a cathode and an organic layer to a thickness of 5 to 40 Å. This method also has a problem in that it is difficult to form a thin film having a uniform thickness of 5 to 40 Å, which is not suitable for large-area deposition.

As described above, various attempts for enhancing electron injection have conventionally been made, but no satisfactory technique has been found yet in view of processibility, driving voltage and efficiency.

SUMMARY OF THE INVENTION

To overcome the above and/or other problems, the present invention provides an organic EL device with a reduced driving voltage, enhanced luminance and improved color coordinate characteristics by increasing an efficiency of injecting electrons from a cathode into an organic layer.

In an aspect of the present invention, an organic EL device includes a cathode, an anode, and organic layers formed between the cathode and the anode. In the organic EL device, the cathode includes a first cathode containing aluminum, and a second cathode disposed under the first cathode, formed in the vicinity of an organic layer and containing a metal having a work function of 3.5 to 5.0 eV, and metallic carboxylate represented by:

RCOOM                         Formula 1 wherein M is an alkali metal or alkaline-earth metal, and R is a $C_1$–$C_{10}$ alkyl or $C_6$–$C_{20}$ aryl.

Additional aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
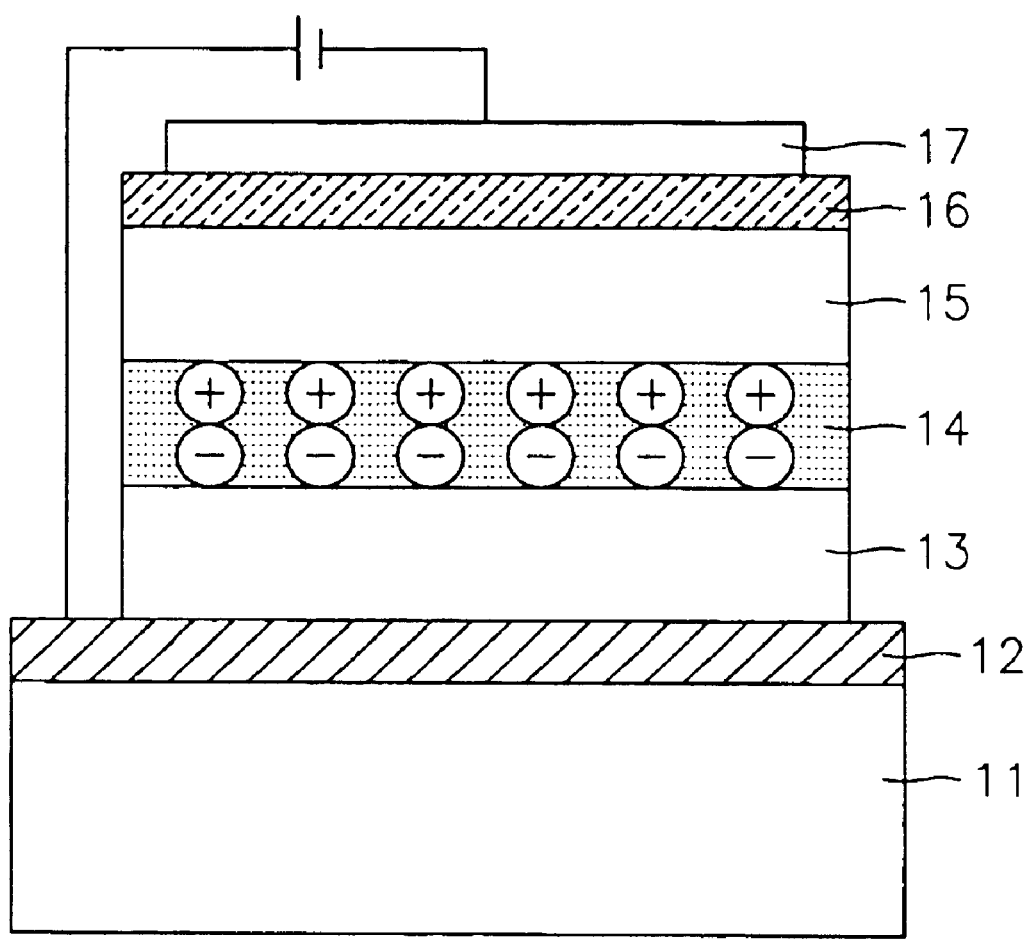
FIG. 1 is a schematic diagram of an organic EL device according to the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

A cathode of the present invention has a bi-layer structure including a first cathode made of Al, and a second cathode containing a cathode forming metal having a work function of 3.5 to 5.0 eV and metallic carboxylate represented by Formula 1. The second cathode is disposed under the first cathode and formed in the vicinity of an organic layer. Examples of the metal having a work function of 3.5 to 5.0 eV include indium (In) (work function: 3.8–4.2 eV), chrome (Cr) (work function: 4.3 eV), aluminum (Al)(work function: 4.3 eV), silver (Ag) (4.6 eV), and Al is most preferred in view of processability. If the work function of the cathode forming metal is less than 3.5 eV, the metal is unstable, resulting in poor processability. If the work function of the cathode forming metal is greater than 5.0 eV, electron injection characteristics undesirably deteriorate.

The metallic carboxylate represented by Formula 1 is an organic material in which a metal (M) functions as the opposite ion to a carboxylate functional group, and examples of the metal M include alkali or alkaline-earth metals having a work function of 4.0 eV or less, specifically 1 to 4.0 eV. The metal is preferably an alkali metal such as lithium (Li), sodium (Na), potassium (K), rubidium (Rb) or cesium (Cs).

$$RCOOM \qquad \text{Formula 1}$$

wherein M is an alkali or alkaline-earth metal, and R is a $C_1$–$C_{10}$ alkyl or $C_6$–$C_{20}$ aryl. In Formula 1, the $C_1$–$C_{10}$ alkyl is preferably a methyl or ethyl group, and the $C_6$–$C_{20}$ aryl is preferably a phenyl group.

The metallic carboxylate of the present invention is preferably lithium acetate ($CH_3COOLi$), lithium benzoate ($C_6H_5COOLi$), potassium acetate ($CH_3COOK$), potassium benzoate ($C_6H_5COOK$), cesium benzoate ($C_6H_5COOCs$), cesium acetate ($CH_3COOCs$), sodium benzoate ($C_6H_5COONa$), sodium acetate ($CH_3COONa$), rubidium benzoate ($C_6H_5COORb$) or rubidium acetate ($CH_3COORb$).

In the second cathode, the mixture ratio of the cathode forming metal to the metallic carboxylate is preferably 1:1 to 10:0.1, more preferably 5:1 to 15:1, and most preferably 10:1.

Figure 2A:
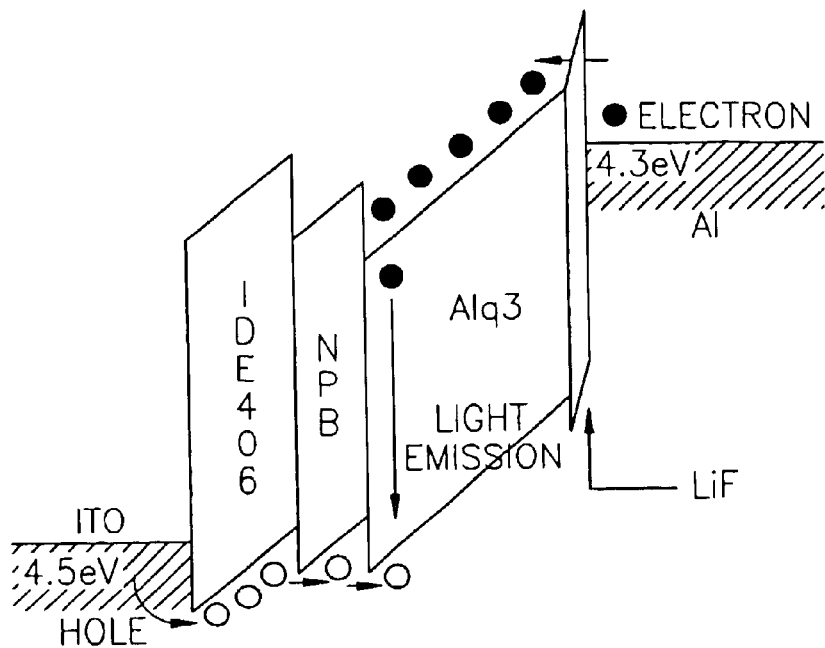
FIG. 2A is an energy band diagram representing an energy gap between the highest occupied molecular orbital (HOMO) of an electron transport layer and the lowest unoccupied molecular orbital LUMO of a cathode, in an organic EL device including a hole injection layer made of IDE 406 (manufactured by IDEMITSU KOSAN, LTD.), a hole transport layer made of N,N'-diphenyl-N,N'-bis(1-naphthyl)-1,1'-biphenyl)-4,4'-diamine (NPB), an electron transport layer made of $Alq_3$, an electron injection layer made of LiF, and a cathode made of Al.
Figure 2B:
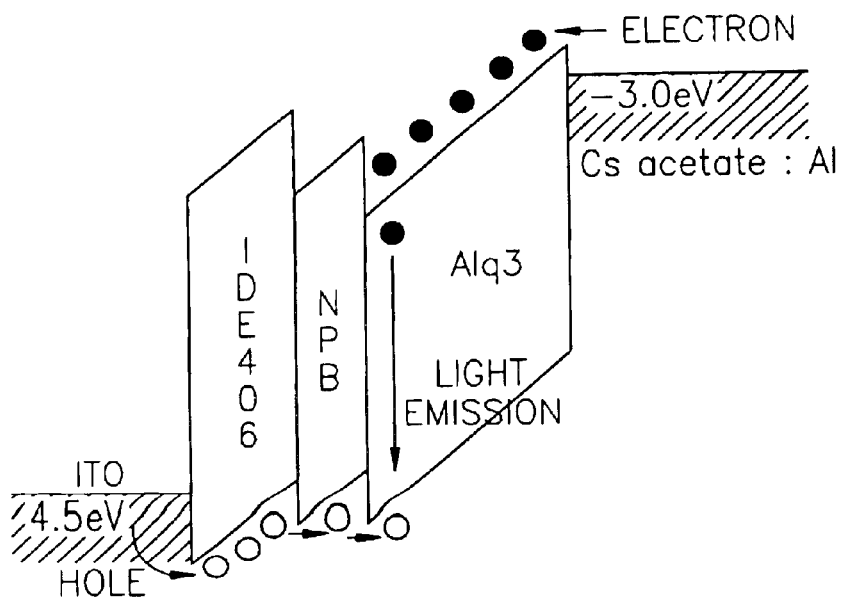
FIG. 2B is an energy band diagram representing an energy gap between the HOMO of an electron transport layer and the LUMO of a cathode, in an organic EL device including a hole injection layer made of IDE 406 (manufactured by IDEMITSU KOSAN, LTD.), a hole transport layer made of NPB, an electron transport layer made of $Alq_3$, and a second cathode disposed in the vicinity of the electron transport layer and made of cesium acetate and Al.

Now, the principle of the present invention will be briefly described referring to FIGS. 2A and 2B, in which IDE 406 (manufactured by IDEMITSU KOSAN, LTD.) is used for forming a hole injection layer, NPB is used for forming a hole transport layer, $Alq_3$ is used for forming an electron transport layer, and the second cathode disposed in the vicinity of the electron transport layer is made of Al and cesium acetate.

The organic EL device shown in FIG. 2A including the electron injection layer (LiF) adjacent to the electron transport layer ($Alq_3$) and the cathode (Al) has an improved electron injection efficiency in an organic layer by a reduced energy barrier height or electron tunneling at the interface between an organic layer and LiF, due to a band bending phenomenon in which the LUMO level of $Alq_3$ is lowered from the interface. In this case, since there is a big energy difference between the LUMO level of $Alq_3$, i.e., 3.0 eV, and the work function level of a cathode, i.e., 4.3 eV, electron injection is not effective due to band bending or electron tunneling. On the other hand, in the organic EL device shown in FIG. 2B, since the second cathode adjacent to the electron transport layer ($Alq_3$) includes Al and cesium acetate, and there is little energy difference between the LUMO of $Alq_3$, i.e., 3.0 eV, and the work function of the cathode, i.e., approximately 3.0 eV, electron injection into an organic layer from the cathode is enhanced even with a low voltage applied.

A method of manufacturing the organic EL device according to the present invention is described below. First, an anode is formed on a substrate and then a hole injection layer is selectively formed on the anode. The hole injection layer decreases contact resistance between the anode and a hole transport layer and increases the hole transporting capability of the anode with respect to an emitter layer (or electron transport layer), thus improving overall characteristics of the device. Usable materials to form the hole injection layer include starburst amine series compounds. The thickness of the hole injection layer is 30 to 100 nm. If the thickness of the hole injection layer is out of the above range, hole injection characteristics are undesirably poor.

Then, a hole transport layer is formed on the hole injection layer. Hole transporting materials to form the hole transport layer include N,N'-di(naphthalene-1-yl)-N,N'-diphenyl-benzidine: α-NPB, -4,4'-diamine] N, N'-bis(3-methylphenyl)-N,N'-diphenyl-(1,1'-biphenyl)-4,4'-diamine (TPD) and the like. The thickness of the hole transport layer is 10 to 50 nm. If the thickness of the hole transport layer is out of the above range, hole injection characteristics are undesirably poor.

In addition to the hole transporting material, the hole transport layer may further include a dopant capable of emitting light at electron-hole combination. Examples of the dopant include 4-(dicyanomethylene)-2-t-butyl-6-(1,1,7,7-tetramethyljulolidyl-9-enyl)-4H-pyran: DCJTB, Coumarin 6, Rubrene, DCM, DCJTB, perylene, quinacridone or the like. The amount of the dopant is 0.1 to 5% by weight based on the weight of the hole transport layer forming material. Use of such a dopant in forming the hole transport layer allows the emitting color to be adjusted according to the kind and content of dopant added, and increases thermal stability of the hole transporting layer, thus improving the life of the device.

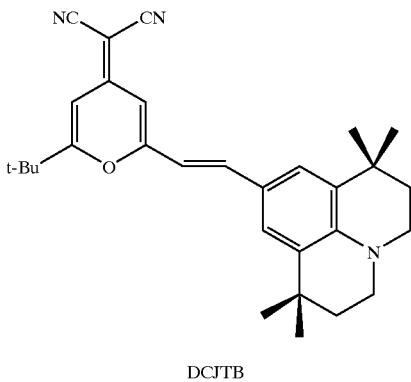

DCJTB

Then, an emitter layer and/or an electron transport layer are formed on the hole transport layer. In an embodiment of the present invention, the emitter layer is not separately formed, but only the electron transport layer serving as an emitter layer is formed.

As electron transporting materials to form the electron transport layer, tris(8-quinolinolate)-aluminum (Alq$_3$) and Almq$_3$ having the following formulas can be used, and a dopant capable of emitting light with respect to electron-hole combination, like the hole transport layer, may be further added. The kind and content of dopant added are substantially the same as those for the hole transport layer. The thickness of the electron transport layer is preferably 30 to 100 nm. If the thickness of the electron transport layer is out of the above range, the efficiency is lowered and a driving voltage increases, which are undesired.

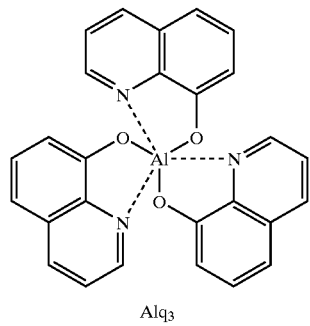

Alq$_3$

-continued

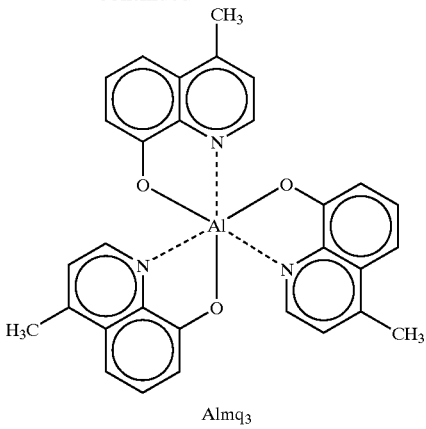

Almq$_3$

Thereafter, codeposition between a cathode forming metal having a work function of 3.5 to 5.0 eV and metallic carboxylate is performed on the emitter layer and/or electron transport layer, thus forming a second cathode. The codeposition method is not specifically limited, but thermal deposition is employed in the present invention.

Preferably, the cathode forming material and the metallic carboxylate having the Formula 1 in the second cathode are mixed in the weight ratio of 1:1 to 10:0.1, more preferably 5:1 to 10:1. If the amount ratio of the metallic carboxylate to the cathode forming material is greater than the above range, the driving voltage increase. If the amount ratio of the metallic carboxylate to the cathode forming material is less than the above range, the electron injection efficiency is undesirably reduced.

Al is then deposited on the second cathode to form a first cathode, followed by hermetically sealing, thus completing the organic EL device according to the present invention shown in FIG. 1.

Referring to FIG. 1, an anode 12 is formed on a substrate 11, and a hole transport layer 13, an emitter layer 14, an electron transport layer 15, and a second cathode 16 and a first cathode 17 disposed in a predetermined pattern in a direction orthogonal to the anode 12, are sequentially stacked on the anode 12.

The thickness of the second cathode 16 is 5 to 100 nm, and the thickness of the first cathode 17 is 10 to 150 nm. The second cathode 16 exhibits little difference in characteristic depending on thickness. However, if the thickness of the second cathode 16 is less than 5 nm, the electron injection efficiency deteriorates. If the thickness of the second cathode 16 is greater than 100 nm, drive deterioration occurs. If the thickness of the first cathode 17 is less than 10 nm, sheet resistance increases, resulting in drive deterioration. If the thickness of the first cathode 17 is greater than 150 nm, thin film formation is difficult to achieve.

An organic EL device can be manufactured in the above-described order, that is, anode/hole transport layer/emitter layer/electron transport layer/cathode, and may be manufactured in the reverse order, that is, cathode/electron transport layer/emitter layer/hole transport layer/anode. In the latter case, the substrate is not necessarily a transparent material, and the aperture ratio becomes advantageously high.

In the organic EL device according to the present invention, a substrate that can be used for a conventional organic EL device, preferably a glass substrate or transparent plastic substrate having good transparency, surface smoothness, manageability and being waterproof, is used. As anode forming materials, indium tin oxide (ITO), tin oxide ($SnO_2$) or zinc oxide (ZnO), which is transparent and has good conductivity, is used. The thickness of the anode is 100 to 200 nm. If the thickness of the anode is greater than the above range, drive deterioration occurs due to sheet resistance and optical properties of the anode undesirably change.

The present invention will be further described with reference to the following examples; however, it should be noted that the present invention is not restricted by these examples.

EXAMPLE 1

An ITO (indium-tin-oxide) electrode layer was formed on a glass substrate to a thickness of 15 nm, and IDE 406 (manufactured by IDEMITSU KASAN LTD.) was vacuum-deposited thereon, to form a hole injection layer having a thickness of 50 nm. Subsequently, NPB was vacuum-deposited on the hole injection layer, to form a hole transport layer having a thickness of 15 nm.

Thereafter, $Alq_3$ was vacuum-deposited on the hole transport layer to form an electron transport layer having a thickness of 70 nm. Al and Cs acetate mixed in a weight ratio of 10:1 were thermally deposited on the electron transport layer to form a second cathode to a thickness of 30 nm. Then, Al was vacuum-deposited on the second cathode to form a first cathode having a thickness of 70 nm.

The resultant product was hermetically sealed, thus completing an organic EL device.

EXAMPLE 2

The same procedure as Example 1 was performed except that Al and Cs acetate were mixed in a weight ratio of 5:1, thus completing an organic EL device.

EXAMPLE 3

The same procedure as Example 1 was performed except that In and Cs acetate were used for the manufacture of the second cathode, instead of Al and Cs acetate, thus completing an organic EL device.

EXAMPLE 4

The same procedure as Example 1 was performed except that Cr and Cs acetate were used for the manufacture of the second cathode, instead of Al and Cs acetate, thus completing an organic EL device.

EXAMPLE 5

The same procedure as Example 1 was performed except that Ag and Cs acetate were used for the manufacture of the second cathode, instead of Al and Cs acetate, thus completing an organic EL device.

EXAMPLE 6

The same procedure as Example 1 was performed except that Al and Cs benzoate were used for the manufacture of the second cathode, instead of Al and Cs acetate, thus completing an organic EL device.

EXAMPLE 7

An ITO electrode was formed on a glass substrate to a thickness of 15 nm, and IDE 406 (manufactured by IDEMITSU KOSAN) was vacuum-deposited thereon, to form a hole injection layer having a thickness of 15 nm. Subsequently, NPB was vacuum-deposited on the hole injection layer, to form a hole transport layer having a thickness of 15 nm.

Thereafter, IDE 120 (manufactured by IDEMITSU KOSAN, LTD.) and IDE 105 (manufactured by IDEMITSU KOSAN, LTD.) mixed in a weight ratio of 97:3 were codeposited on the hole transport layer to form an electron injection layer having a thickness of 30 nm. $Alq_3$ was vacuum-deposited on the electron injection layer to form an electron transport layer having a thickness of 30 nm.

Then, Al and Cs acetate mixed in a weight ratio of 94:6 were thermally deposited on the electron transport layer to form a second cathode to a thickness of 30 nm. Subsequently, Al was vacuum-deposited on the second cathode to form a first cathode having a thickness of 70 nm.

The resultant product was hermetically sealed, thus completing an organic EL device.

EXAMPLE 8

The same procedure as Example 7 was performed except that Al and Cs acetate were mixed in a weight ratio of 92:8, thus completing an organic EL device.

COMPARATIVE EXAMPLE 1

An ITO layer was formed on a glass substrate to a thickness of 150 nm, and IDE 406 (manufactured by IDEMITSU KOSAN, LTD.) was vacuum-deposited thereon, to form a hole injection layer having a thickness of 50 nm. Subsequently, NPB was vacuum-deposited on the hole injection layer, to form a hole transport layer having a thickness of 15 nm.

Thereafter, $Alq_3$ was vacuum-deposited on the hole transport layer to form an electron transport layer having a thickness of 70 nm. LiF was vacuum-deposited on the electron transport layer to form an LiF electron injection layer having a thickness of 1 nm, and Al was then vacuum-deposited on the LiF electron injection layer to form an Al electrode having a thickness of 150 nm.

The resultant product was hermetically sealed, thus completing an organic EL device.

COMPARATIVE EXAMPLE 2

An ITO layer was formed on a glass substrate to a thickness of 15 nm, and IDE 406 (manufactured by IDEMITSU KOSAN, LTD) was vacuum-deposited thereon, to form a hole injection layer having a thickness of 15 nm. Subsequently, NPB was vacuum-deposited on the hole injection layer, to form a hole transport layer having a thickness of 15 nm.

Thereafter, IDE 120 (manufactured by IDEMITSU KOSAN, LTD.) and IDE 105 (manufactured by IDEMITSU KOSAN, LTD.) mixed in a weight ratio of 97:3 were codeposited on the hole transport layer to form an electron injection layer having a thickness of 30 nm. $Alq_3$ was vacuum-deposited on the electron injection layer to form an electron transport layer having a thickness of 30 nm.

Then, LiF was vacuum-deposited on the electron transport layer to form an LiF electron injection layer having a thickness of 1 nm, and Al was then vacuum-deposited on the LiF electron injection layer to form an Al electrode having a thickness of 150 nm.

The resultant product was hermetically sealed, thus completing an organic EL device.

COMPARATIVE EXAMPLE 3

An ITO layer was formed on a glass substrate to a thickness of 15 nm, and IDE 406 (manufactured by IDE- MITSU KOSAN, LTD.) was vacuum-deposited thereon, to form a hole injection layer having a thickness of 15 nm. Subsequently, NPB was vacuum-deposited on the hole injection layer, to form a hole transport layer having a thickness of 15 nm.

Thereafter, $Alq_3$ was vacuum-deposited on the hole transport layer to form an electron transport layer having a thickness of 30 nm.

Subsequently, Li acetate was thermally deposited on the electron transport layer to form an electron injection layer, and Al was then vacuum-deposited on the electron injection layer to form an Al electrode having a thickness of 150 nm.

The resultant product was hermetically sealed, thus completing an organic EL device.

In the organic EL devices manufactured in Examples 1–2 and Comparative Example 1, driving voltage, maximum luminance, emitting efficiency and color coordinate characteristics were evaluated. The evaluation was performed under the current density of 10 to 100 $mA/cm^2$.

Figure 3:
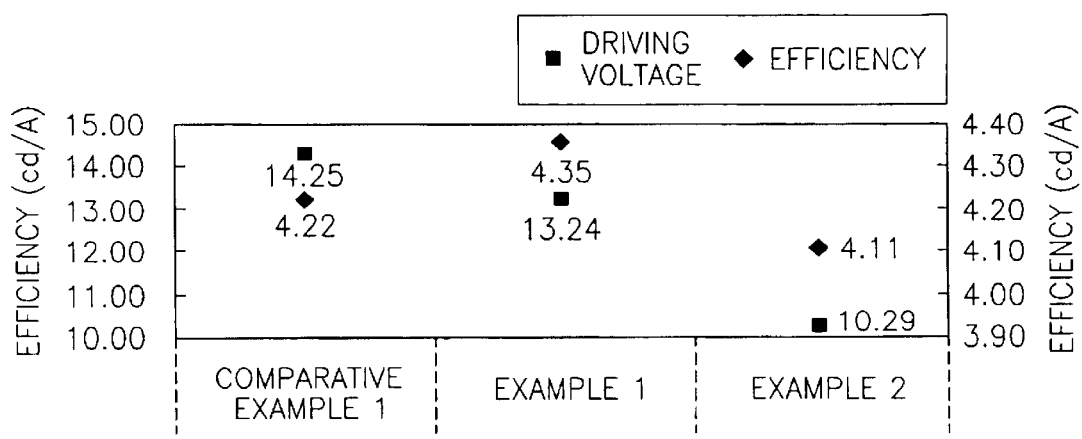
FIG. 3 shows driving voltage and efficiency characteristics of organic EL devices prepared in Examples 1–2 of the present invention and Comparative Example 1.
Figure 4:
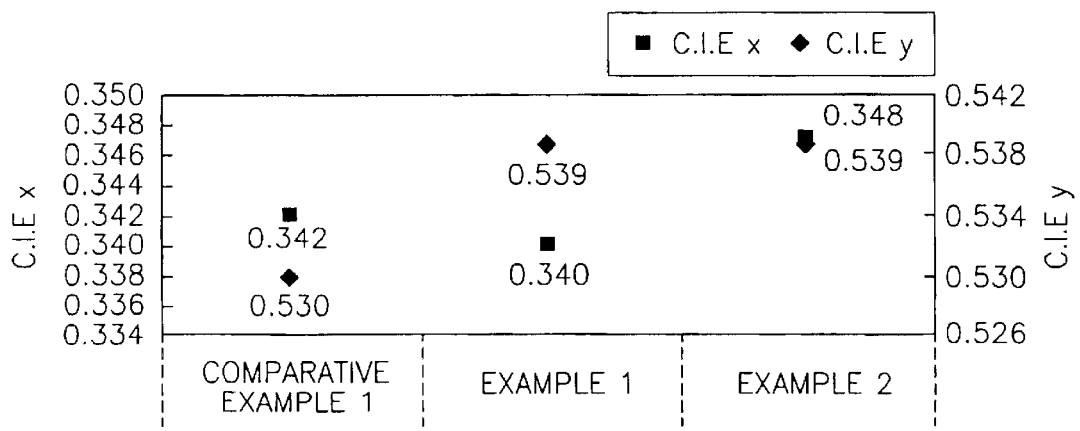
FIG. 4 shows color coordinate characteristics of organic EL devices prepared in Examples 1–2 of the present invention and Comparative Example 1.

The evaluation results are shown in Table 1 and FIGS. 3 and 4.

TABLE 1

| | Driving voltage (V) | Maximum luminance ($cd/m^2$) | Emiting efficiency (cd/A) | C.I.E. x | C.I.E. y |
|---|---|---|---|---|---|
| Example 1 | 13.24 | 4349 | 4.35 | 0.340 | 0.539 |
| Example 2 | 10.29 | 4109 | 4.11 | 0.348 | 0.539 |
| Comparative Example 1 | 14.25 | 4221 | 4.22 | 0.342 | 0.530 |

As shown in Table 1 and FIGS. 3 and 4, the organic EL devices manufactured in Examples 1 and 2 exhibited a reduced driving voltage, and substantially the same levels of maximum luminance, electroluminescence efficiency and color coordinate characteristics as those of the organic EL device manufactured in Comparative Example 1.

Also, the organic EL devices manufactured in Examples 3 through 6 exhibited substantially the same levels of driving voltage, maximum luminance, electroluminescence efficiency and color coordinate characteristics as those of the organic EL device manufactured in Example 1.

Figure 5:
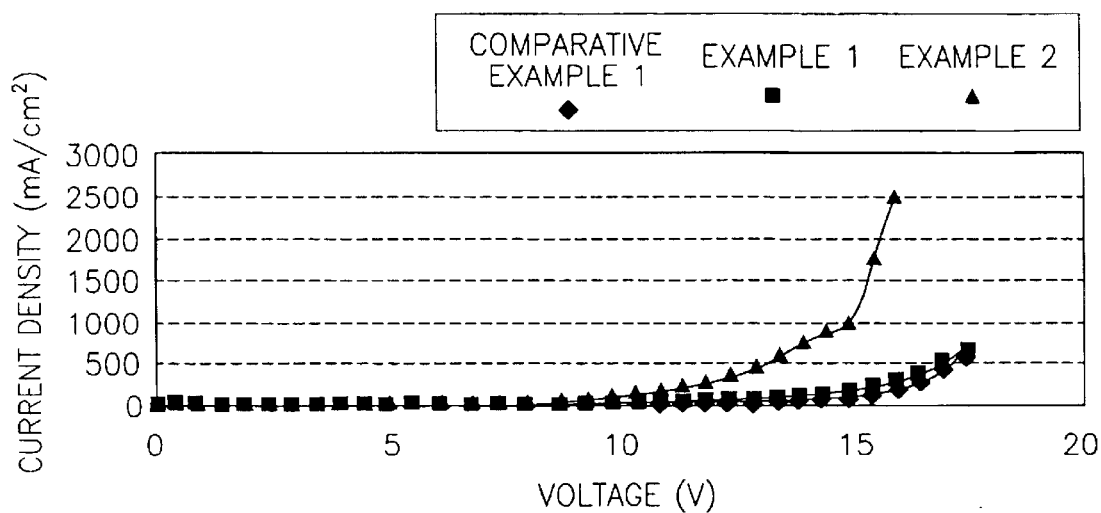
FIG. 5 shows voltage versus current density characteristics of organic EL devices prepared in Examples 1–2 of the present invention and Comparative Example 1.

In the organic EL devices manufactured in Examples 1 and 2 and Comparative Examples 1, a change in current density depending on voltage is shown in FIG. 5.

Referring to FIG. 5, at the same voltage level, the organic EL devices manufactured in Examples 1 and 2 had larger current densities than the current density of the organic EL device manufactured in Comparative Example 1, confirming enhanced electron injection.

In the organic EL devices manufactured in Examples 7 and 8 and Comparative Examples 2, driving voltage, maximum luminance, emitting efficiency, power efficiency and color coordinate characteristics were evaluated. The evaluation was performed under the current density of 10 to 100 $mA/cm^2$.

Figure 6:
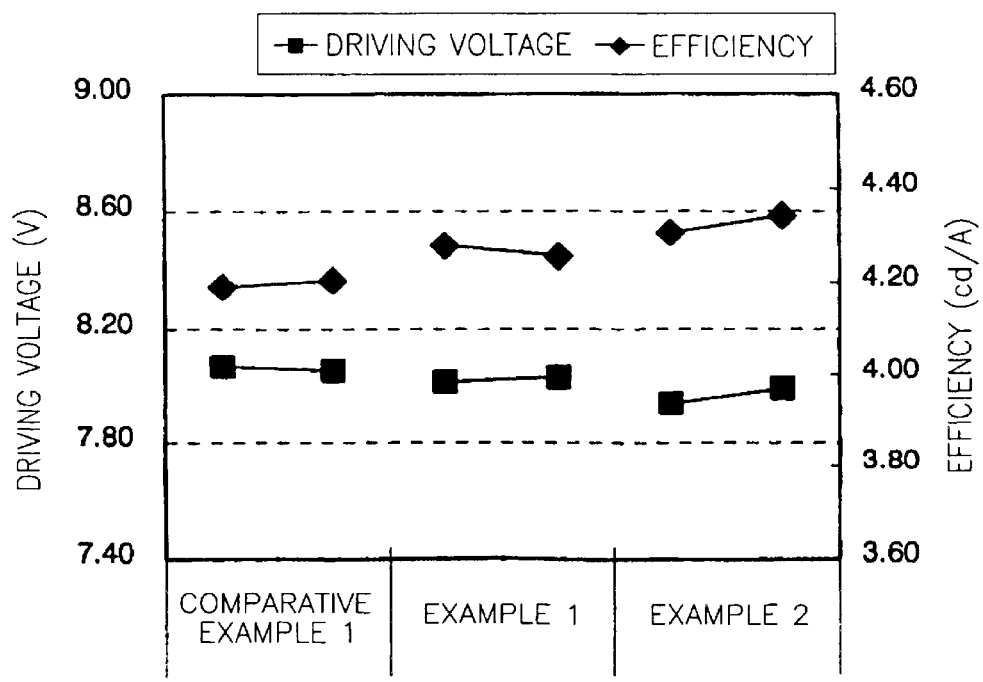
FIG. 6 shows driving voltage and efficiency characteristics of organic EL devices prepared in Examples 7–8 of the present invention and Comparative Example 2.
Figure 7:
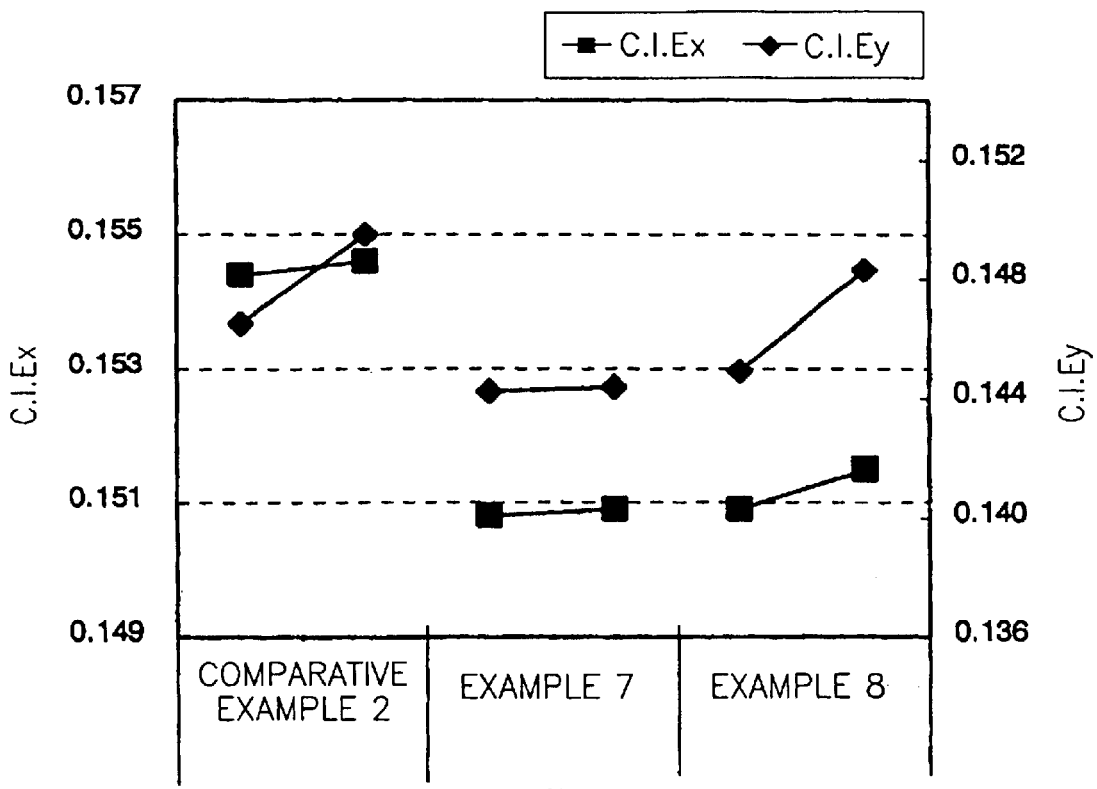
FIG. 7 shows color coordinate characteristics of organic EL devices prepared in Examples 7–8 of the present invention and Comparative Example 2.

The evaluation results are shown in Table 2 and FIGS. 5 and 6.

TABLE 2

| | Driving voltage (V) | Maximum luminance ($cd/m^2$) | Emitting efficiency (cd/A) | Power efficiency (lm/W) | C.I.E. X | C.I.E. Y |
|---|---|---|---|---|---|---|
| Example 7 | 8.01 | 4277 | 4.28 | 1.66 | 0.151 | 0.144 |
| | 8.03 | 4257 | 4.26 | 1.65 | 0.151 | 0.144 |
| Example 8 | 7.94 | 4305 | 4.31 | 1.70 | 0.151 | 0.145 |
| | 8.00 | 4344 | 4.34 | 1.71 | 0.152 | 0.148 |
| Comparative Example 2 | 8.07 | 4192 | 4.19 | 1.63 | 0.154 | 0.147 |
| | 8.05 | 4205 | 4.21 | 1.64 | 0.155 | 0.150 |

As shown in Table 2 and FIGS. 5 and 6, the organic EL devices manufactured in Examples 7 and 8 exhibited a reduced driving voltage, and substantially the same levels of maximum luminance, emitting efficiency, power efficiency and color coordinate characteristics as those of the organic EL device manufactured in Comparative Example 2.

Figure 8:
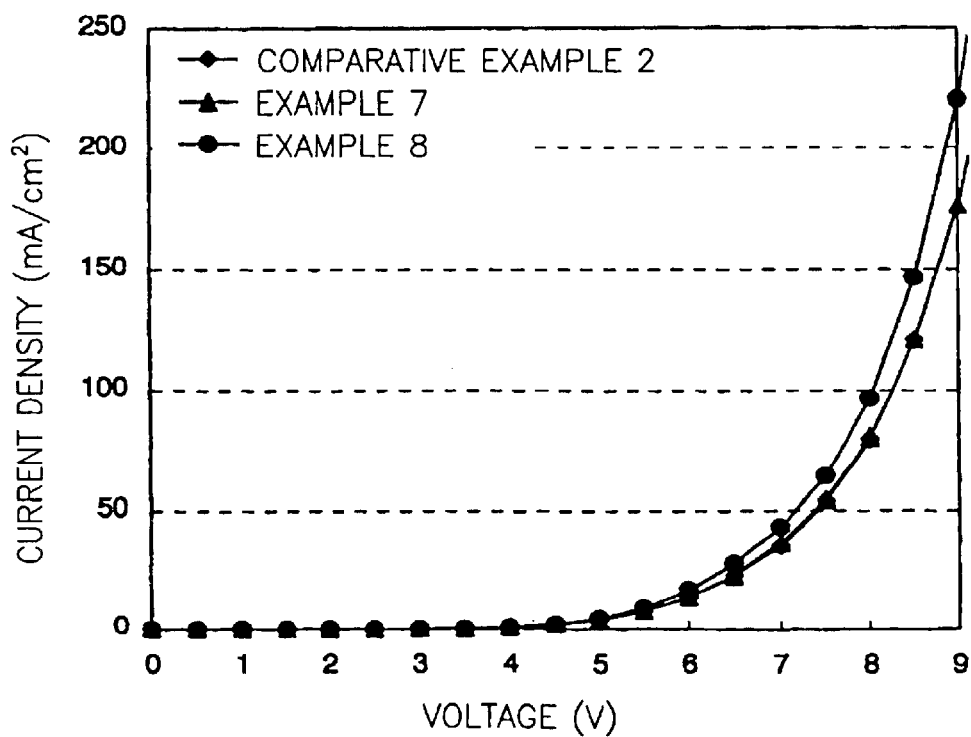
FIG. 8 shows voltage versus current density characteristics of organic EL devices prepared in Examples 7–8 of the present invention and Comparative Example 2.

In the organic EL devices manufactured in Examples 7 and 8 and Comparative Examples 2, a change in current density depending on voltage is shown in FIG. 8.

Referring to FIG. 8, at the same voltage level, the organic EL devices manufactured in Examples 7 and 8 had larger current densities than the current density of the organic EL device manufactured in Comparative Example 2, confirming enhanced electron injection.

Figure 9:
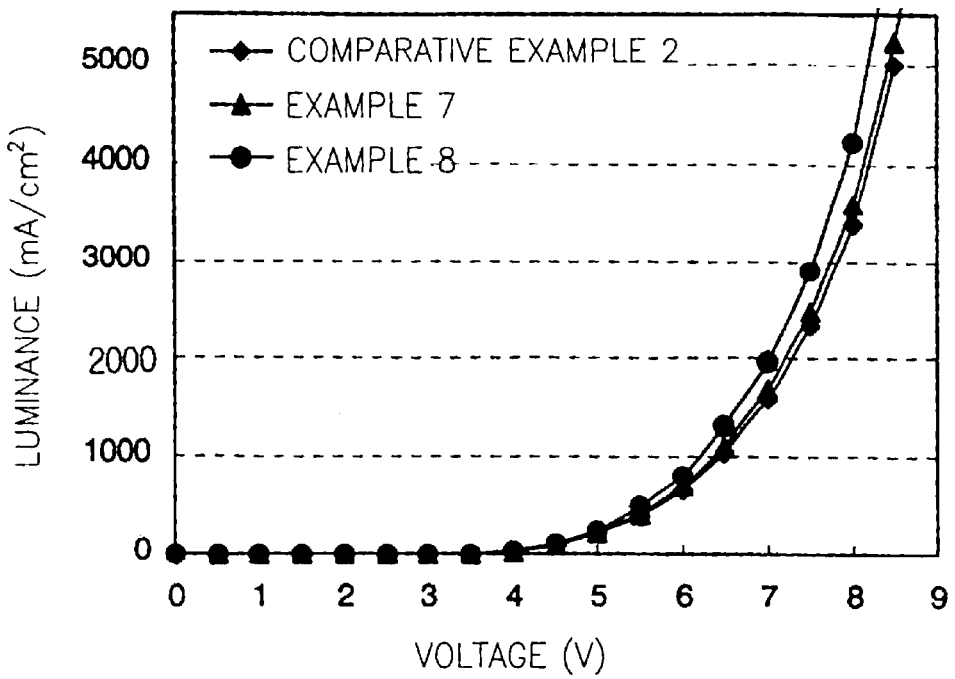
FIG. 9 shows voltage versus luminance characteristics of organic EL devices prepared in Examples 7–8 of the present invention and Comparative Example 2.

In the organic EL devices manufactured in Examples 7 and 8 and Comparative Examples 2, a change in luminance depending on voltage is shown in FIG. 9.

Referring to FIG. 9, at the same voltage level, the organic EL devices manufactured in Examples 7 and 8 had higher luminance than the organic EL device manufactured in Comparative Example 2.

Figure 10:
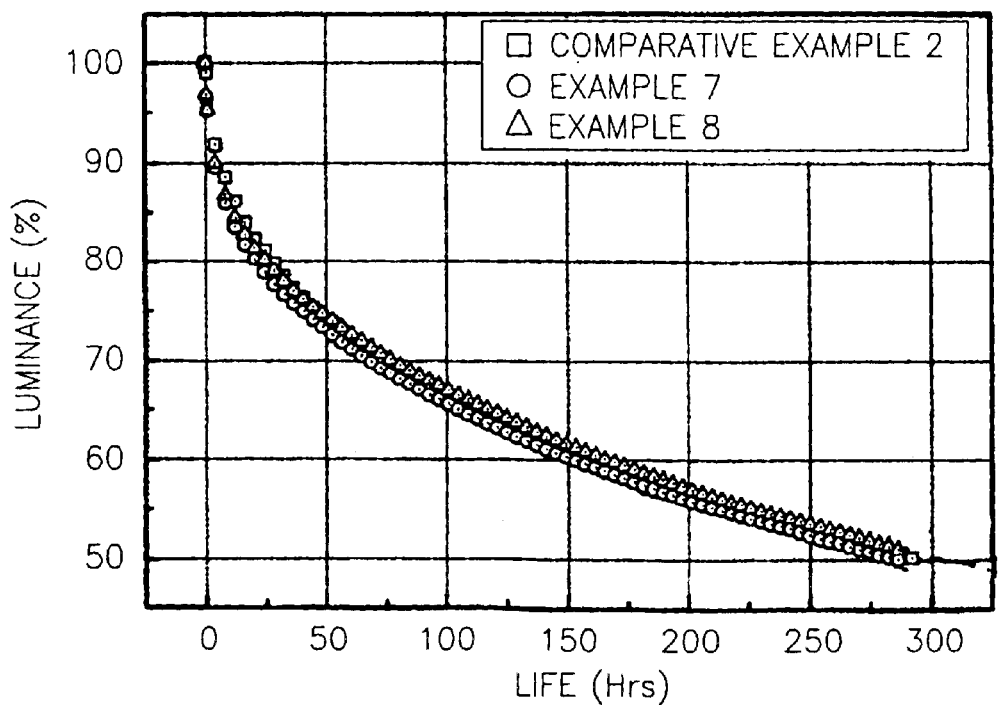
FIG. 10 shows life characteristics of organic EL devices prepared in Examples 7–8 of the present invention and Comparative Example 2.

Also, in the organic EL devices manufactured in Examples 7 and 8 and Comparative Examples 2, life characteristics thereof were examined, and the results are shown in FIG. 10. The life characteristics were measured under the same current density (45.45 $mA/cm^2$).

Referring to FIG. 10, under the same current density, the life characteristics of the compared organic EL devices are substantially the same. However, since the luminance characteristics of the organic EL devices manufactured in Examples 7 and 8 are superior to those of the organic EL device manufactured in Comparative Example 2, it can be confirmed that the lifetimes of the organic EL devices manufactured in Examples 7 and 8 were longer than the lifetime of the organic EL device manufactured in Comparative Example 2, under the same luminance level.

In the organic EL devices manufactured in Examples 1 and 2 and Comparative Examples 3, driving voltage, maximum luminance, emitting efficiency and color coordinate characteristics were evaluated. The evaluation was performed under the current density of 10 to 100 $mA/cm^2$.

Figure 11:
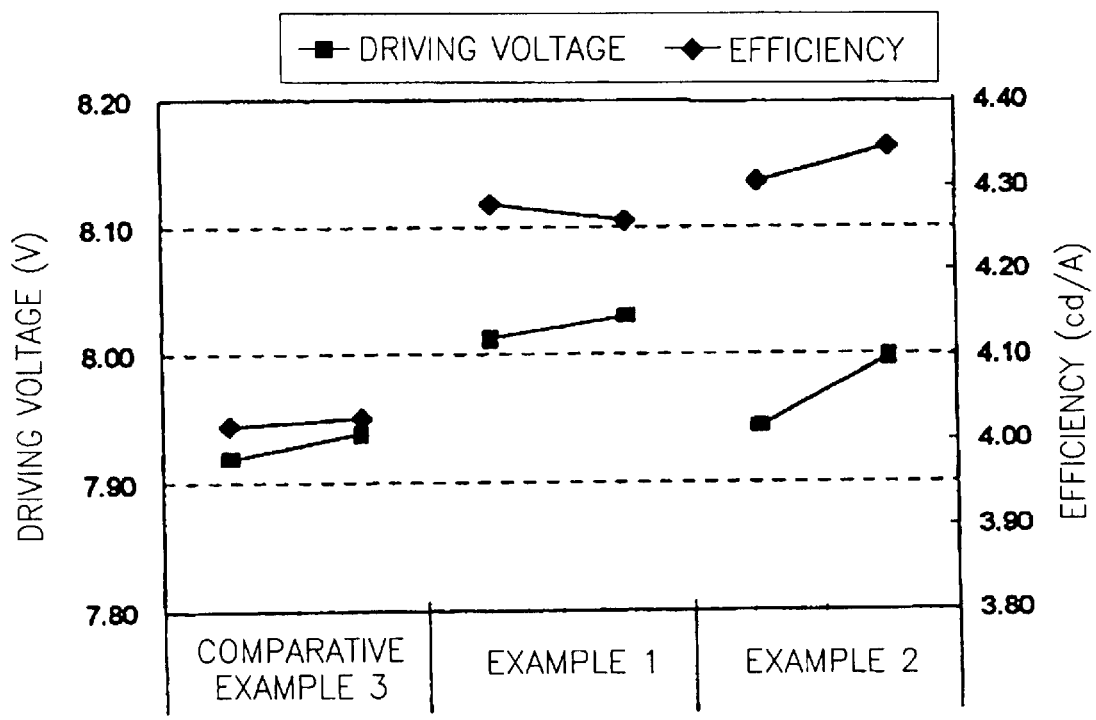
FIG. 11 shows driving voltage and efficiency characteristics of organic EL devices prepared in Examples 1–2 of the present invention and Comparative Example 3.

The evaluation results are shown in Table 3 and FIG. 11.

TABLE 3

| | Driving voltage (V) | Maximum luminance ($cd/m^2$) | Emitting efficiency (cd/A) | Power efficiency (lm/W) | C.I.E. x | C.I.E. y |
|---|---|---|---|---|---|---|
| Example 1 | 8.01 | 4277 | 4.28 | 1.66 | 0.151 | 0.144 |
| | 8.03 | 4257 | 4.26 | 1.65 | 0.151 | 0.144 |

TABLE 3-continued

| | Driving voltage (V) | Maximum luminance (cd/m²) | Emitting efficiency (cd/A) | Power efficiency (lm/W) | C.I.E. x | C.I.E. y |
|---|---|---|---|---|---|---|
| Example 2 | 7.94 | 4305 | 4.31 | 1.70 | 0.151 | 0.145 |
| | 8.00 | 4344 | 4.34 | 1.71 | 0.152 | 0.148 |
| Comparative Example 3 | 7.92 | 4016 | 4.02 | 1.59 | 0.151 | 0.148 |
| | 7.94 | 4026 | 4.03 | 1.59 | 0.151 | 0.151 |

As shown in Table 3 and FIG. 11, the organic EL devices manufactured in Examples 1 and 2 exhibited substantially the same levels of driving voltage and color coordinate characteristics, but were superior to the organic EL device manufactured in Comparative Example 3 in view of maximum luminance and electroluminescence efficiency.

Figure 12:
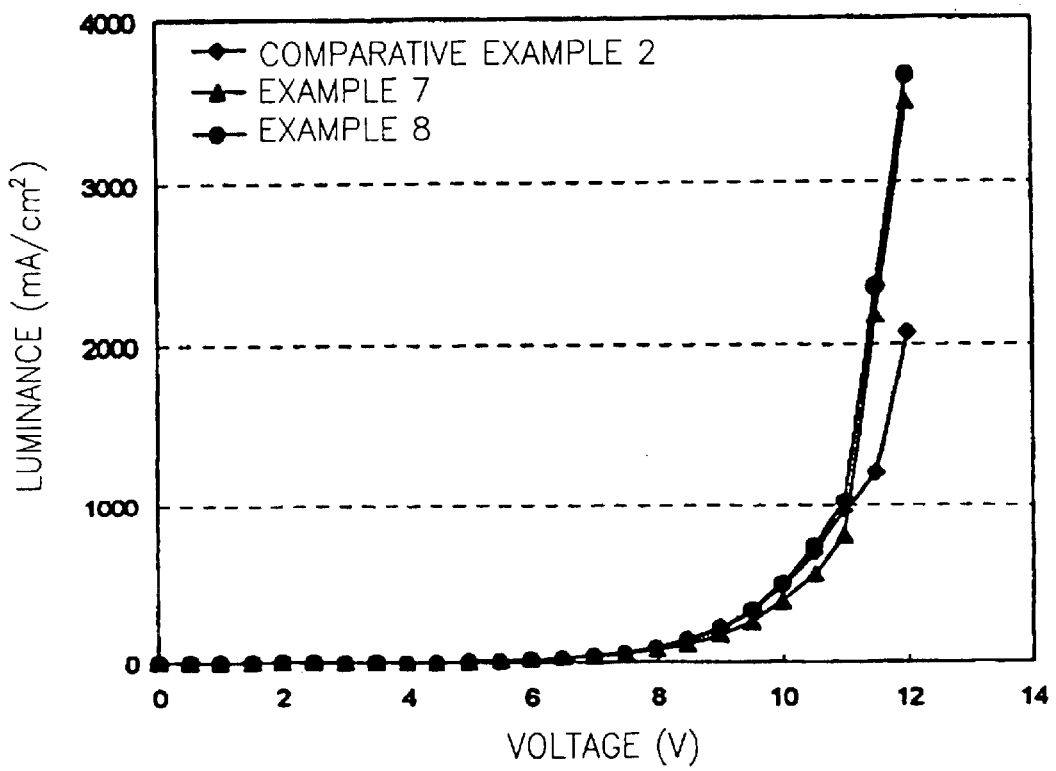
FIG. 12 shows voltage versus current density characteristics of organic EL devices prepared in Examples 1–2 of the present invention and Comparative Example 3.

In the organic EL devices manufactured in Examples 1 and 2 and Comparative Examples 3, a change in current density depending on voltage is shown in FIG. 12.

Referring to FIG. 12, at the same voltage level, the organic EL devices manufactured in Examples 1 and 2 had larger current densities than the current density of the organic EL device manufactured in Comparative Example 3, confirming enhanced electron injection.

Figure 13:
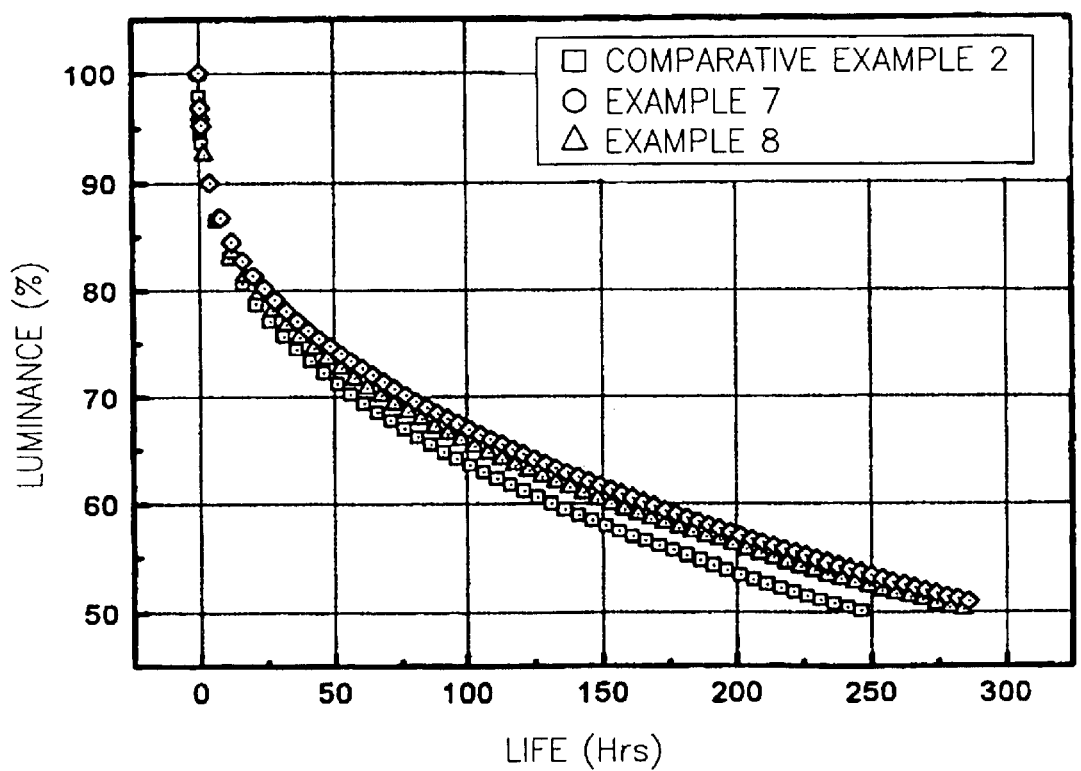
FIG. 13 shows life characteristics of organic EL devices prepared in Examples 1–2 of the present invention and Comparative Example 3.

Also, in the organic EL devices manufactured in Examples 1 and 2 and Comparative Examples 3, life characteristics thereof were examined, and the results are shown in FIG. 13. The life characteristics were measured under the same current density (45.45 mA/).

Referring to FIG. 13, under the same luminance level, the lifetimes of the organic EL devices manufactured in Examples 1 and 2 are longer than that of the organic EL device manufactured in Comparative Examples 3.

In the organic EL device according to the present invention, an energy barrier difference between an electron transport layer and a cathode is reduced, thus enhancing an electron injection efficiency. Therefore, the organic EL device has a reduced driving voltage, while exhibiting good emitting efficiency, color coordinate and luminance characteristics.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic electroluminescent (EL) device having a cathode, an anode, and an arrangement of organic layers formed between the cathode and the anode, wherein the cathode comprises:

a second cathode disposed on the arrangement of organic layers and containing a metal having a work function of 3.5 to 5.0 eV, and metallic carboxylate represented by:

RCOOM                Formula 1 wherein M is an alkali metal or alkaline-earth metal, and R is a $C_1$–$C_{10}$ alkyl or $C_6$–$C_{20}$ aryl; and a first cathode containing aluminum, disposed on the second cathode.

2. The organic EL device according to claim 1, wherein the metal having a work function of 3.5 to 5.0 eV is at least one selected from the group consisting of aluminum (Al), indium (In), chrome (Cr) and silver (Ag).

3. The organic EL device according to claim 1, wherein in the metallic carboxylate represented by Formula 1, the metal is lithium (Li), sodium (Na), potassium (K), rubidium (Rb) or cesium (Cs).

4. The organic EL device according to claim 1, wherein in Formula 1, R is a methyl, ethyl or phenyl group.

5. The organic EL device according to claim 1, wherein the metallic carboxylate is at least one selected from the group consisting of lithium acetate ($CH_3COOLi$), lithium benzoate ($C_6H_5COOLi$), potassium acetate ($CH_3COOK$), potassium benzoate ($C_6H_5COOK$), cesium benzoate ($C_6H_5COOCs$), cesium acetate ($CH_3COOCs$), sodium benzoate ($C_6H_5COONa$), sodium acetate ($CH_3COONa$), rubidium benzoate ($C_6H_5COORb$) and rubidium acetate ($CH_3COORb$).

6. The organic EL device according to claim 1, wherein in the second cathode, a mixture ratio of the metal having a work function of 3.5 to 5.0 eV to the metallic carboxylate represented by Formula 1 is 1:1 to 10:0.1.

7. The organic EL device according to claim 1, wherein in the second cathode, a mixture ratio of the metal having a work function of 3.5 to 5.0 eV to the metallic carboxylate represented by Formula 1 is 5:1 to 10:1.

8. The organic EL device according to claim 1, wherein the thickness of the first cathode is in the range of 10 to 150 nm, and the thickness of the second cathode is in the range of 5 to 100 nm.

9. The organic EL device according to claim 1, wherein the organic layers include at least one selected from the group consisting of an electron transport layer, an emitter layer, a hole transport layer and a hole injection layer.

10. The organic EL device according to claim 1 wherein the organic EL device comprises a display device in an electronic device.

11. The organic EL device according to claim 10 wherein the electronic device is one of a pager, a cellular telephone, a portable telephone, a two-way radio, a video game, a portable digital assistant, a portable television, a portable computer, a notebook computer, a calculator, a computer, a telephone, a check-out device that registers purchases, a monitoring device, and a digital clock.

12. The organic EL device according to claim 1, comprising an indium-tin-oxide electrode layer formed on a glass substrate to a thickness of approximately 15 nm, a hole injection layer having a thickness of approximately 50 nm vacuum deposited thereon, a hole transport layer having a thickness of approximately 15 nm vacuum-deposited on the hole injection layer, Alq$_3$ vacuum-deposited on the hole transport layer to form an electron transport layer having a thickness of approximately 70 nm, Al and Cs acetate mixed in a weight ratio of 10:1 thermally deposited on the electron transport layer to form a second cathode to a thickness of approximately 30 nm, and Al vacuum-deposited on the second cathode to form a first cathode having a thickness of approximately 70 nm.

13. The organic EL device according to claim 1, comprising an indium-tin-oxide electrode layer formed on a glass substrate to a thickness of approximately 15 nm, a hole injection layer having a thickness of approximately 50 nm vacuum deposited thereon, a hole transport layer having a thickness of approximately 15 nm vacuum-deposited on the hole injection layer, Alq$_3$ vacuum-deposited on the hole transport layer to form an electron transport layer having a thickness of approximately 70 nm, Al and Cs acetate mixed in a weight ratio of 5:1 thermally deposited on the electron transport layer to form a second cathode to a thickness of approximately 30 nm, and Al vacuum-deposited on the second cathode to form a first cathode having a thickness of approximately 70 nm.

14. The organic EL device according to claim 1, comprising an indium-tin-oxide electrode layer formed on a glass substrate to a thickness of approximately 15 nm, a hole injection layer having a thickness of approximately 50 nm vacuum deposited thereon, a hole transport layer having a thickness of approximately 15 nm vacuum-deposited on the hole injection layer, Alq$_3$ vacuum-deposited on the hole transport layer to form an electron transport layer having a thickness of approximately 70 nm, Al and Cs benzoate mixed in a weight ratio of 10:1 thermally deposited on the electron transport layer to form a second cathode to a thickness of approximately 30 nm, and Al vacuum-deposited on the second cathode to form a first cathode having a thickness of approximately 70 nm.

15. The organic EL device according to claim 2, wherein in the second cathode, the metal having a work function of 3.5 to 5.0 eV is aluminum, and a mixture ratio of Al to the metallic carboxylate represented by Formula 1 is 1:1 to 10:0.1.

16. The organic EL device according to claim 2, wherein in the second cathode, the metal having a work function of 3.5 to 5.0 eV is aluminum, and a mixture ratio of Al to the metallic carboxylate represented by Formula 1 is 5:1 to 10.1.

* * * * *